US012628662B2

(12) United States Patent (10) Patent No.: US 12,628,662 B2
Teoh et al. (45) Date of Patent: May 12, 2026

(54) SEMICONDUCTOR CHIP, CHIP SYSTEM, METHOD OF FORMING A SEMICONDUCTOR CHIP, AND METHOD OF FORMING A CHIP SYSTEM

(71) Applicant: Infineon Technologies AG, Neubiberg (DE)

(72) Inventors: Hooi Boon Teoh, Melaka (MY); Hao Zhuang, Hohenbrunn (DE); Oliver Blank, Villach (AT); Paul Armand Calo, Villach (AT); Markus Dinkel, Unterhaching (DE); Josef Höglauer, Kirchheim-Heimstetten (DE); Daniel Hölzl, Reisbach (DE); Wee Aun Jason Lim, Bukit Katil (MY); Gerhard Thomas Nöbauer, Villach (AT); Ralf Otremba, Kaufbeuren (DE); Martin Pölzl, Ossiach (AT); Ying Pok Sam, Bukit Katil (MY); Xaver Schlögel, Sachsenkam (DE); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 597 days.

(21) Appl. No.: 18/085,746

(22) Filed: Dec. 21, 2022

(65) Prior Publication Data

US 2023/0230903 A1     Jul. 20, 2023

(30) Foreign Application Priority Data

Jan. 17, 2022    (DE) ..................... 10 2022 100 969.6

(51) Int. Cl.
H01L 23/495        (2006.01)
H10W 70/40         (2026.01)
(Continued)

(52) U.S. Cl.
CPC ......... H10W 70/417 (2026.01); H10W 72/90 (2026.01); H10W 72/01953 (2026.01);
(Continued)

(58) Field of Classification Search
CPC .... H01L 23/49513; H01L 24/32; H01L 24/83
See application file for complete search history.

(56) References Cited

U.S. PATENT DOCUMENTS

| 7,233,031 B2 | 6/2007 | Mauder et al. |
| 8,237,285 B2 * | 8/2012 | Tanida .............. H01L 21/76898 |
| | | 257/E21.597 |

(Continued)

FOREIGN PATENT DOCUMENTS

| DE | 103 30 571 | 2/2005 |
| DE | 10 2011 076 662 | 6/2012 |

(Continued)

*Primary Examiner* — Dale E Page
*Assistant Examiner* — Wilner Jean Baptiste
(74) *Attorney, Agent, or Firm* — Dicke, Billig & Czaja, PLLC

(57) ABSTRACT

A semiconductor chip is provided. The semiconductor chip may include a front side including a control chip contact and a first controlled chip contact, a back side including a second controlled chip contact, a backside metallization formed over the back side in contact with the second controlled chip contact, and a stop region extending at least partially along an outer edge of the back side between a contact portion of the backside metallization and the outer edge of the back side. The contact portion is configured to be attached to an electrically conductive structure by a die attach material, a surface of the stop region is recessed with respect to a surface of the contact portion, and/or the surface of the stop region has a lower wettability with respect to the die attach material than the contact portion.

16 Claims, 12 Drawing Sheets

(51) Int. Cl.

| | |
|---|---|
| *H10W 72/90* | (2026.01) |
| *H10W 72/00* | (2026.01) |
| *H10W 72/30* | (2026.01) |
| *H10W 72/59* | (2026.01) |
| *H10W 90/00* | (2026.01) |

(52) U.S. Cl.
  CPC .... *H10W 72/07336* (2026.01); *H10W 72/352* (2026.01); *H10W 72/387* (2026.01); *H10W 72/59* (2026.01); *H10W 90/736* (2026.01)

(56) References Cited

U.S. PATENT DOCUMENTS

| | | | |
|---|---|---|---|
| 9,209,080 B2 | 12/2015 | Schneegans et al. | |
| 9,337,155 B2 | 5/2016 | Beer et al. | |
| 2014/0264868 A1 | 9/2014 | Radulescu et al. | |
| 2015/0179623 A1 | 6/2015 | Ono et al. | |
| 2015/0279806 A1* | 10/2015 | Wu ........................ | H01L 23/13 |
| | | | 257/737 |
| 2018/0240765 A1* | 8/2018 | Emori ................... | H01L 23/481 |
| 2019/0393182 A1 | 12/2019 | Yamada | |
| 2021/0193520 A1 | 6/2021 | Kosaka et al. | |

FOREIGN PATENT DOCUMENTS

| | | |
|---|---|---|
| DE | 10 2013 113 751 | 6/2014 |
| DE | 10 2013 205 138 | 9/2014 |
| EP | 2605278 | 6/2013 |
| JP | S58 16 538 | 1/1983 |
| JP | 2009 111 187 | 5/2009 |

* cited by examiner

| Package Type | Die Attach Medium | Clearance chip | |
|---|---|---|---|
| | | X (μm) | Y (μm) |
| TDSON-8 | Solder Paste | ≥ 200 | ≥ 200 |

Figure 8:
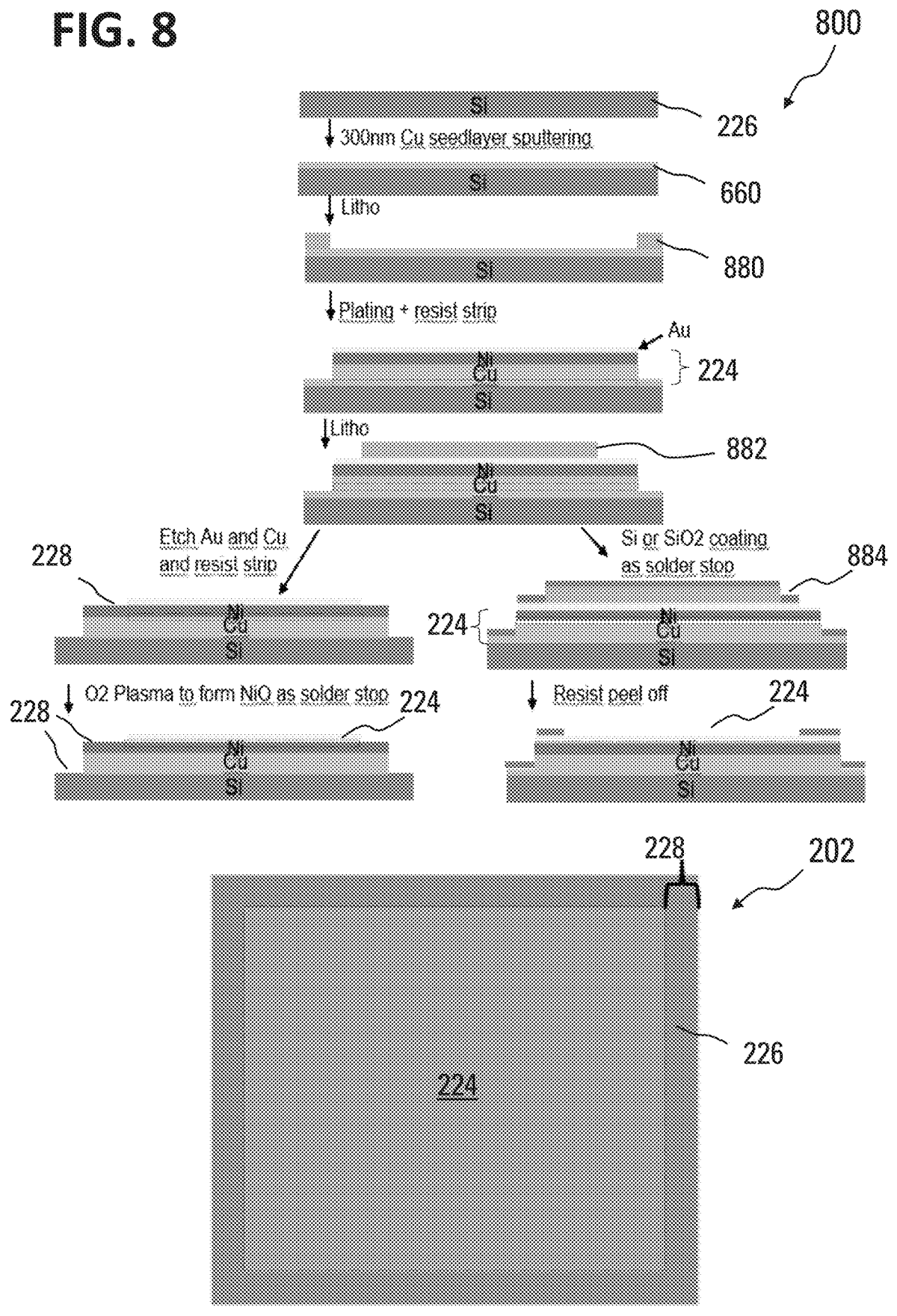

↓ 300nm Cu seedlayer sputtering

Si — 660

↓ Litho

Si — 880

↓ Plating + resist strip

Au
Ni
Cu } 224
Si

↓ Litho

882

Ni
Cu
Si

Etch Au and Cu and resist strip

Si or SiO2 coating as solder stop

228

Ni
Cu
Si

884

224 {
Ni
Cu
Si

↓ O2 Plasma to form NiO as solder stop 224

228

Ni
Cu
Si

228

↓ Resist peel off 224

Ni
Cu
Si 228 202

226

224

FIG. 9A
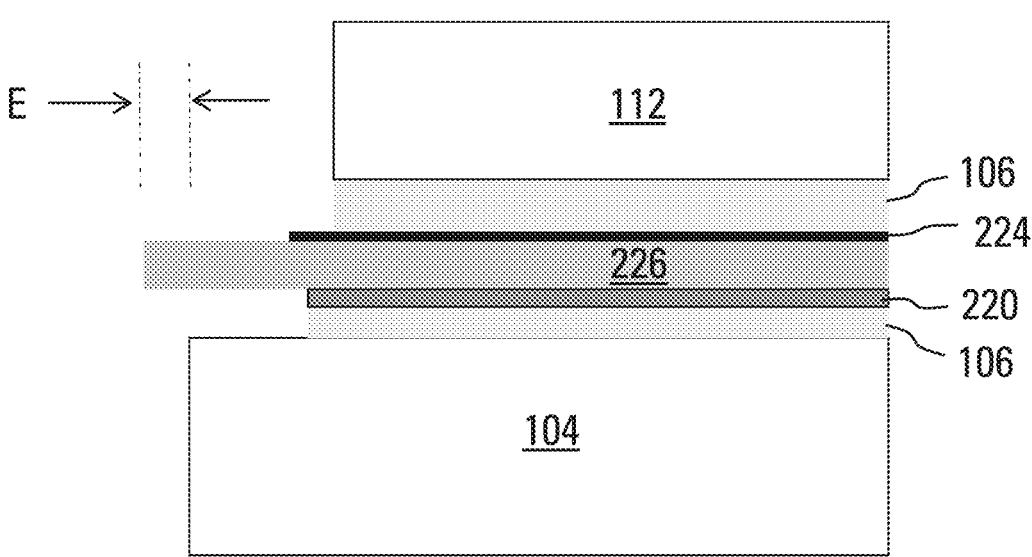
FIG. 9B

1110 forming a backside metallization over a back side of a semiconductor chip, wherein the semiconductor chip comprises a front side comprising a control chip contact and a first controlled chip contact and a back side comprising a second controlled chip contact, and the backside metallization is formed in contact with the second controlled chip contact;

Figure 11:
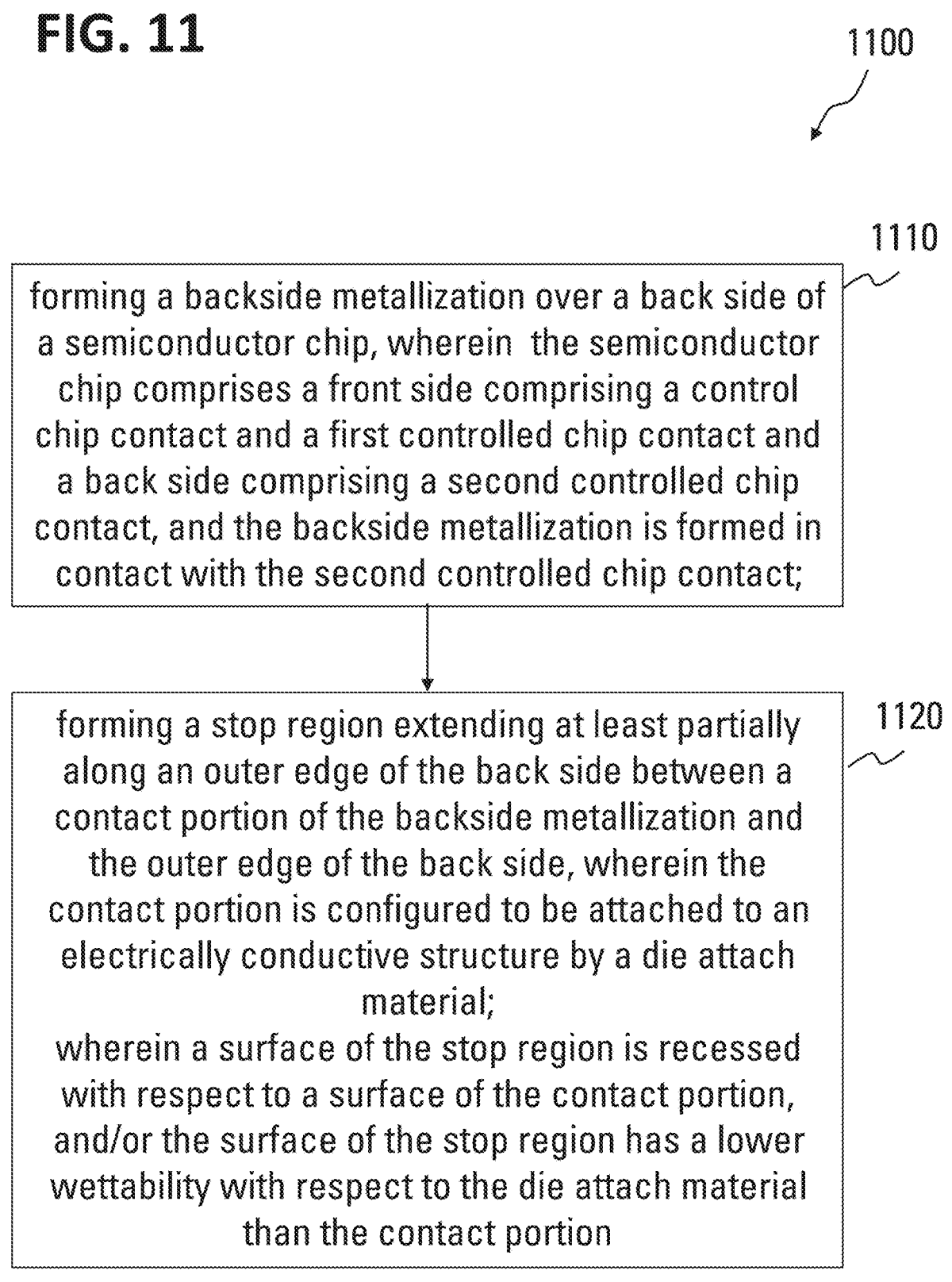

1120 forming a stop region extending at least partially along an outer edge of the back side between a contact portion of the backside metallization and the outer edge of the back side, wherein the contact portion is configured to be attached to an electrically conductive structure by a die attach material;
wherein a surface of the stop region is recessed with respect to a surface of the contact portion, and/or the surface of the stop region has a lower wettability with respect to the die attach material than the contact portion

Figure 12:
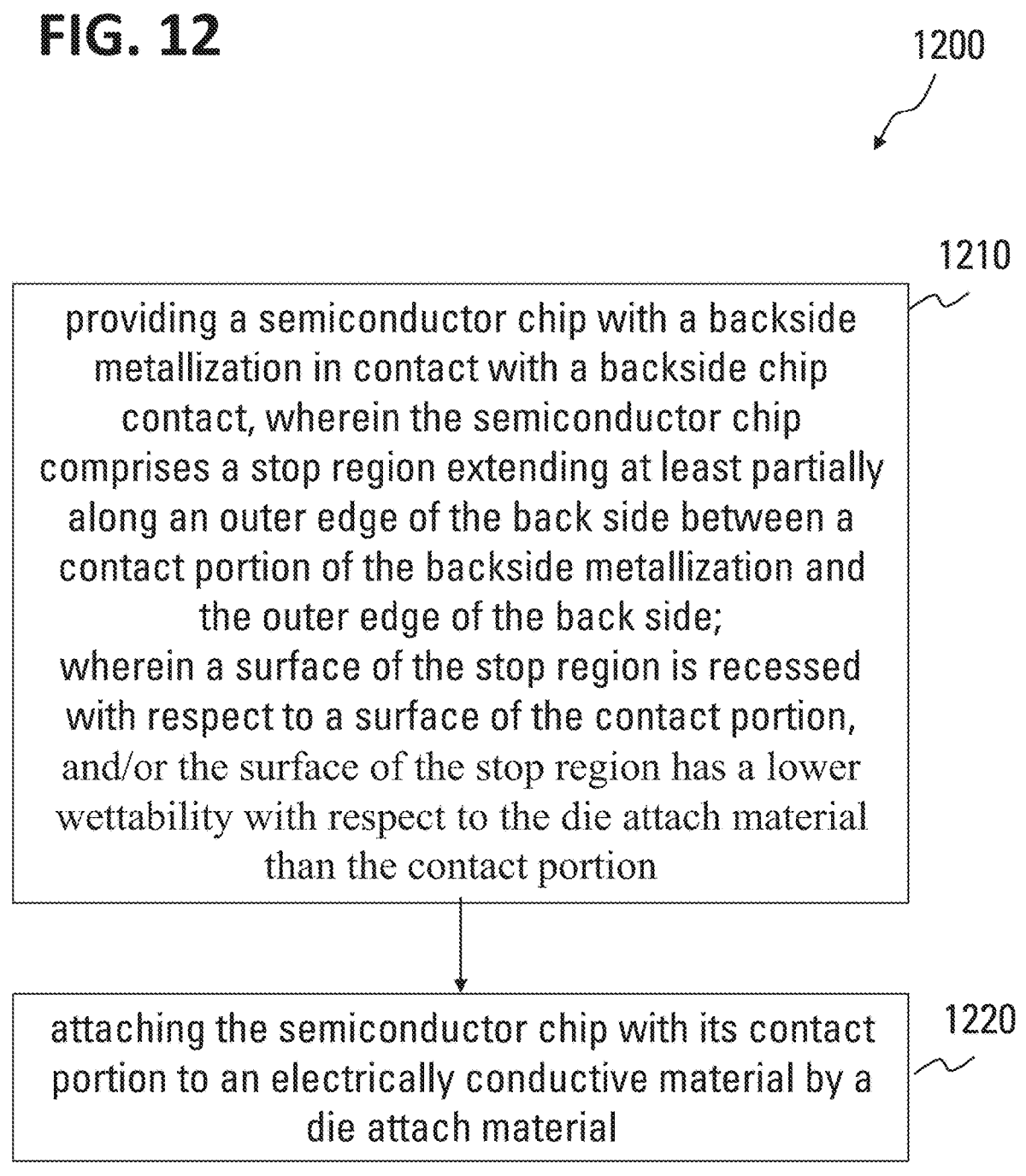

1210 providing a semiconductor chip with a backside
metallization in contact with a backside chip
contact, wherein the semiconductor chip
comprises a stop region extending at least partially
along an outer edge of the back side between a
contact portion of the backside metallization and
the outer edge of the back side;
wherein a surface of the stop region is recessed
with respect to a surface of the contact portion,
and/or the surface of the stop region has a lower
wettability with respect to the die attach material
than the contact portion

1220 attaching the semiconductor chip with its contact
portion to an electrically conductive material by a
die attach material

SEMICONDUCTOR CHIP, CHIP SYSTEM, METHOD OF FORMING A SEMICONDUCTOR CHIP, AND METHOD OF FORMING A CHIP SYSTEM

CROSS-REFERENCE TO RELATED APPLICATION

This Utility Patent Application claims priority to German Patent Application No. 10 2022 100 969.6, filed Jan. 17, 2022, which is incorporated herein by reference.

TECHNICAL FIELD

Various embodiments relate generally to a semiconductor chip, chip system, method of forming a semiconductor chip, and method of forming a chip system.

BACKGROUND

FIG. 1 illustrates how a chip package 100 including a chip 102 (also referred to as die) is formed according to a prior art.

The processes include, from top left to bottom right of the panels illustrating the process, a depositing of a soft solder 106, a die 102 attach, another solder 110 depositing process on the chip 102 top, a clip 112 attach process, and a molding process with a mold material 114.

Here, the chip size may be limited by the die pad (also referred to as die paddle) size (in other words, the pad to which the chip 102 is attached using the solder 106): a maximum chip size may be defined and limited (in X and Y direction) by a clearance between the die pad edge and chip edge.

The clearance of chip to die pad may be critical to ensure sufficient space for solder 106 bleedout, A2 dendrite growth and to minimize delamination after stress.

If a larger-than-standard chip 102 is to be used, the prior art typically employs one of two techniques to make this possible: Either to use a larger dedicated etched leadframe 104 (that provides the die pad), which incurs higher costs, or to use a source-down configuration, wherein a chip front side is attached to the die pad of the leadframe 104, which means that the structurization of the source pad confines the solder 106 under the chip 102, but increases a risk of gate solder voids, causes a source active area reduction due to flip chip design rules, and increases the cost because the source down technology regularly incurs higher costs than standard die bond technology.

SUMMARY

A semiconductor chip is provided. The semiconductor chip may include a front side including a control chip contact and a first controlled chip contact, a back side including a second controlled chip contact, a backside metallization formed over the back side in contact with the second controlled chip contact, and a stop region extending at least partially along an outer edge of the back side between a contact portion of the backside metallization and the outer edge of the back side, wherein the contact portion is configured to be attached to an electrically conductive structure by a die attach material, wherein a surface of the stop region is recessed with respect to a surface of the contact portion, and/or the surface of the stop region has a lower wettability with respect to the die attach material than the contact portion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

Figure 6:
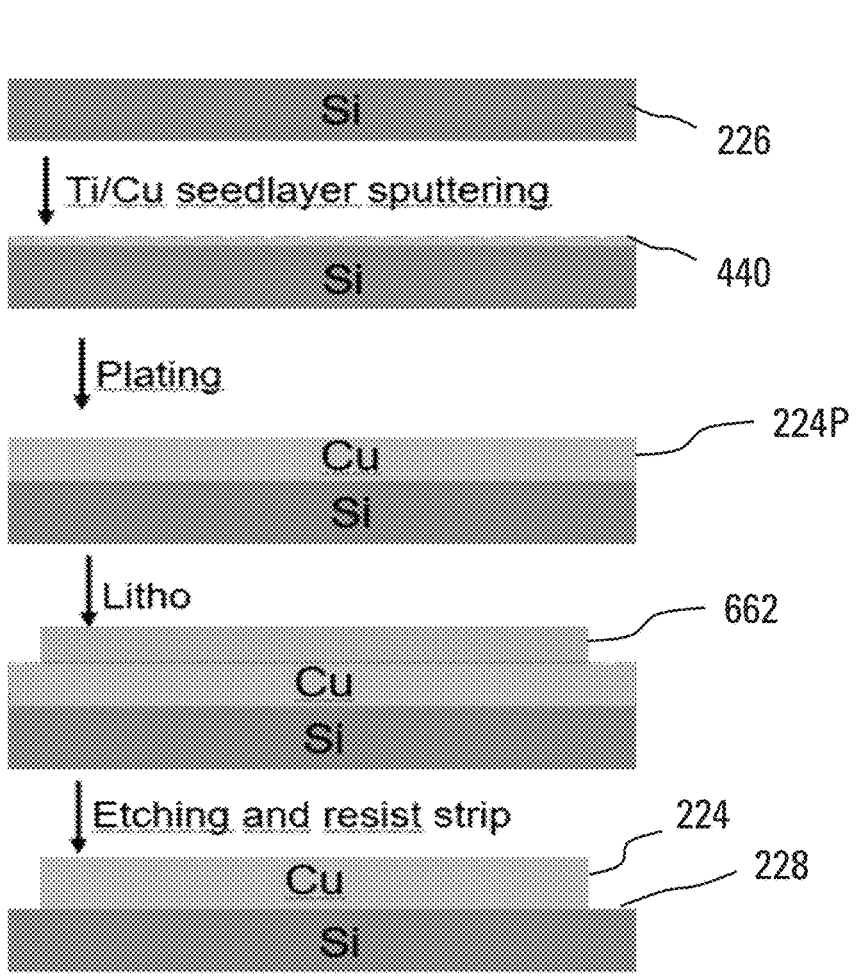
Figure 6:
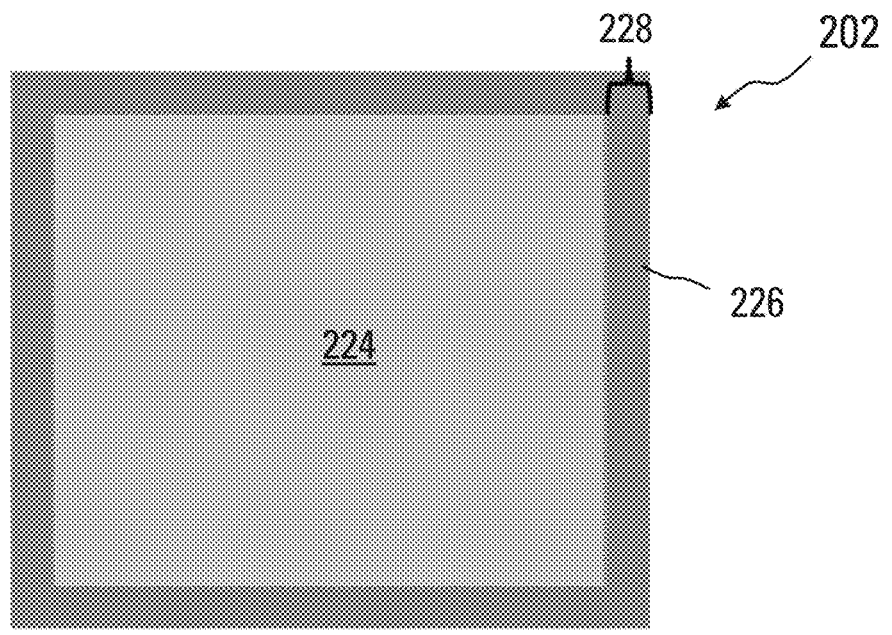
Figure 7:
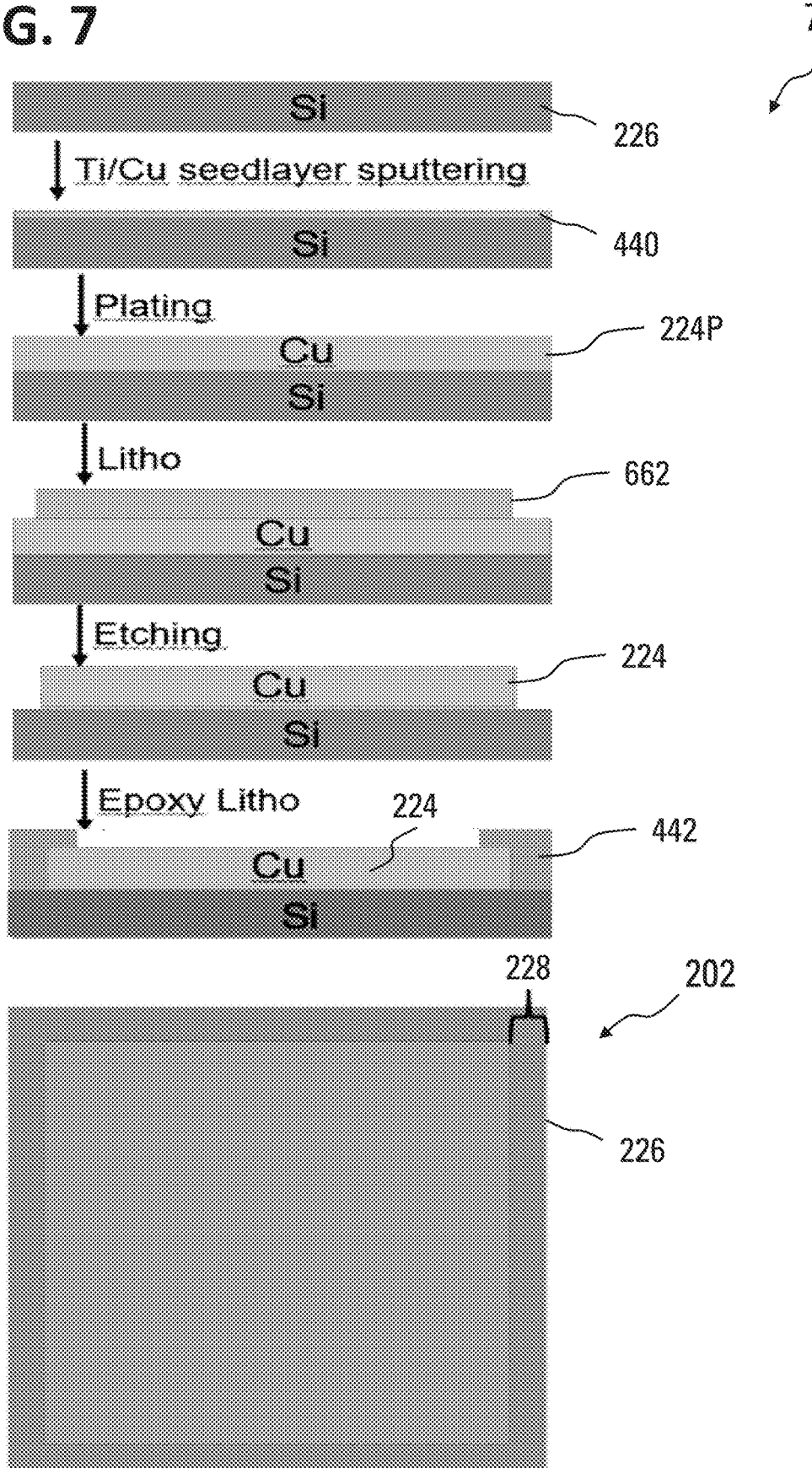
Figures 10A, 10B:
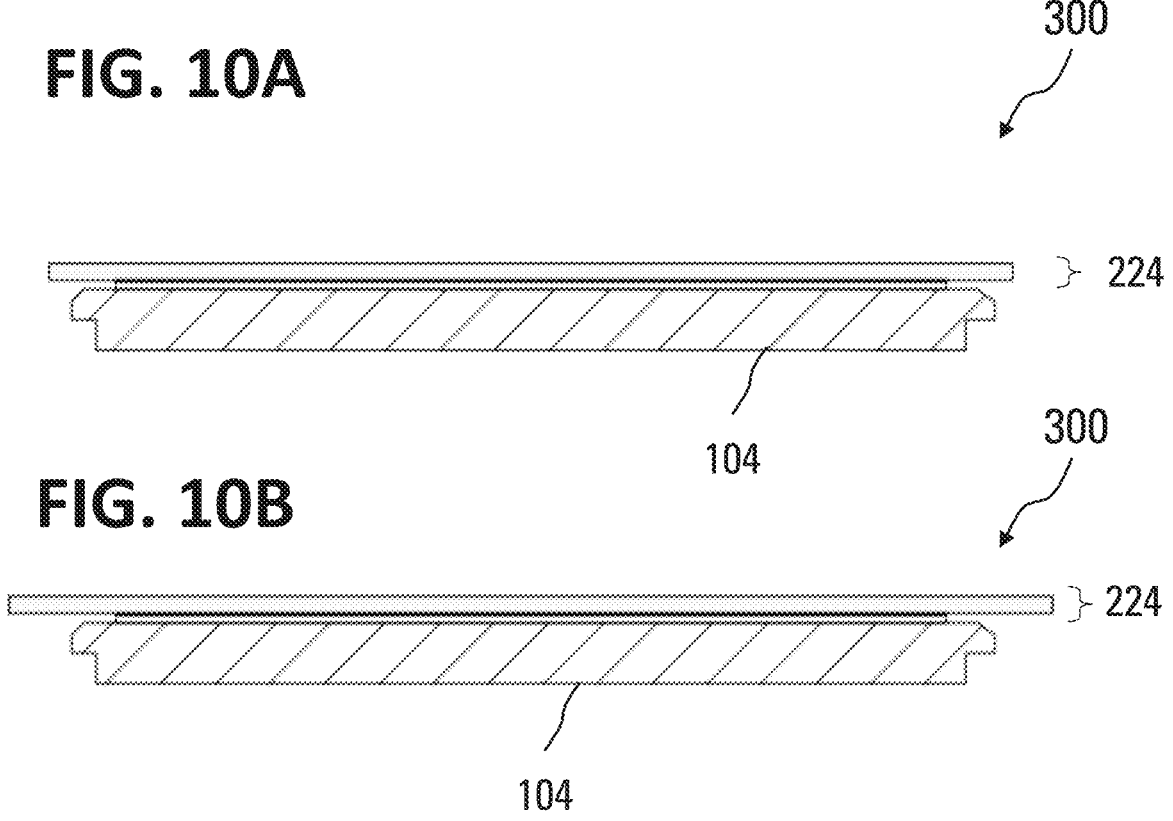

each of FIGS. 6, 7 and 8 illustrates a method of forming a semiconductor chip in accordance with various embodiments as a sequence of schematic process images;

FIG. 9A illustrates, as a partial schematic cross-sectional view, a chip system with a chip in a source-down configuration in accordance with various embodiments;

FIG. 9B illustrates, as a partial schematic cross-sectional view, a chip system with a chip in a source-up configuration in accordance with various embodiments;

each of FIG. 10A and FIG. 10B illustrates, as schematic cross-sectional views, a chip system in accordance with various embodiments;

FIG. 11 shows a process flow of a method of forming a semiconductor chip in accordance with various embodiments; and FIG. 12 shows a process flow of a method of forming a chip system in accordance with various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a semiconductor chip with a structured backside metallization with a solder stop is provided, wherein a bleed-out of die attach material can be limited using the solder stop. This means that the size of the chip may no longer be limited by the size of the die pad, but only by a maximum size of a mold body of a final chip package to be formed.

As another way to phrase it, a chip size in an existing chip package may be maximized by providing a structured backside metallization of the chip as a bleedout stopper or by providing an additional bleedout stopper with the (e.g. structured) backside metallization.

As yet another way to phrase it, the use of a structured chip backside metallization (e.g. a copper backside metallization) means increasing the chip size while maintaining smaller foot print.

The maximum die size in a chip package may in various embodiments be significantly increased, for example a chip size increase of between about 25% and 40%, while on the other hand having little or no impact on assembly cost.

The method of forming a semiconductor chip and the method of forming a chip system (e.g., a chip package) to increase the chip size may be used in context with various die attach methods, i.e., using soft solder die attach, diffusion soldering, and/or glue die attach.

In various embodiments, the backisde metallization (BSM), which may for example include or consist of copper, may be directly structured, for example by etching. The backside metallization may in various embodiments be etched in a region around, e.g. adjacent to, the chip edge. Further metal around the chip edge may be provided, for example to improve a die crack behavior.

In various embodiments, a bleedout stop (usually referred to as "solder stop", but since the stop in accordance with various embodiments is also applicable to, e.g., electrically conductive adhesive (e.g., glue), the term "bleedout stop" is used; however, unless explicity stated otherwise, a "solder stop" as mentioned herein is to be understood to be applicable (if necessary with optional amendments) to any kind of die attach material.

In various embodiments, a die attach bleedout may be confined by the chip back side bleedout stop. A solder creepage onto the chip side wall may be avoided.

The solder stop may in various embodiments include or consist of a metal, an oxide, or a polymers, or may be formed by a recessed surface of an edge region.

A chip with a structured backside metallization in accordance with various embodiments may be used as a drop-in solution in present processes.

In various embodiments, at least one of two concepts may be applied to provide the bleedout stop: a) the semiconductor chip may be configured to provide, in a position in which it is attached with its back side to an electrically conductive element, e.g. a leadframe, sufficient space adjacent to the backside metallization underneath the chip where the die attach material may flow to, in other words, a region besides a contact portion may have a recessed surfaces, and/or b) a surface of the stop region may have a lower wettability for the die attach material than the backside metallization (and optionally lower than a wettability of a surface of the electrically conductive element). Optionally, the two concepts may be combined, by providing the bleedout stop as a recessed region with a low wettability for the die attach material.

Figure 1:
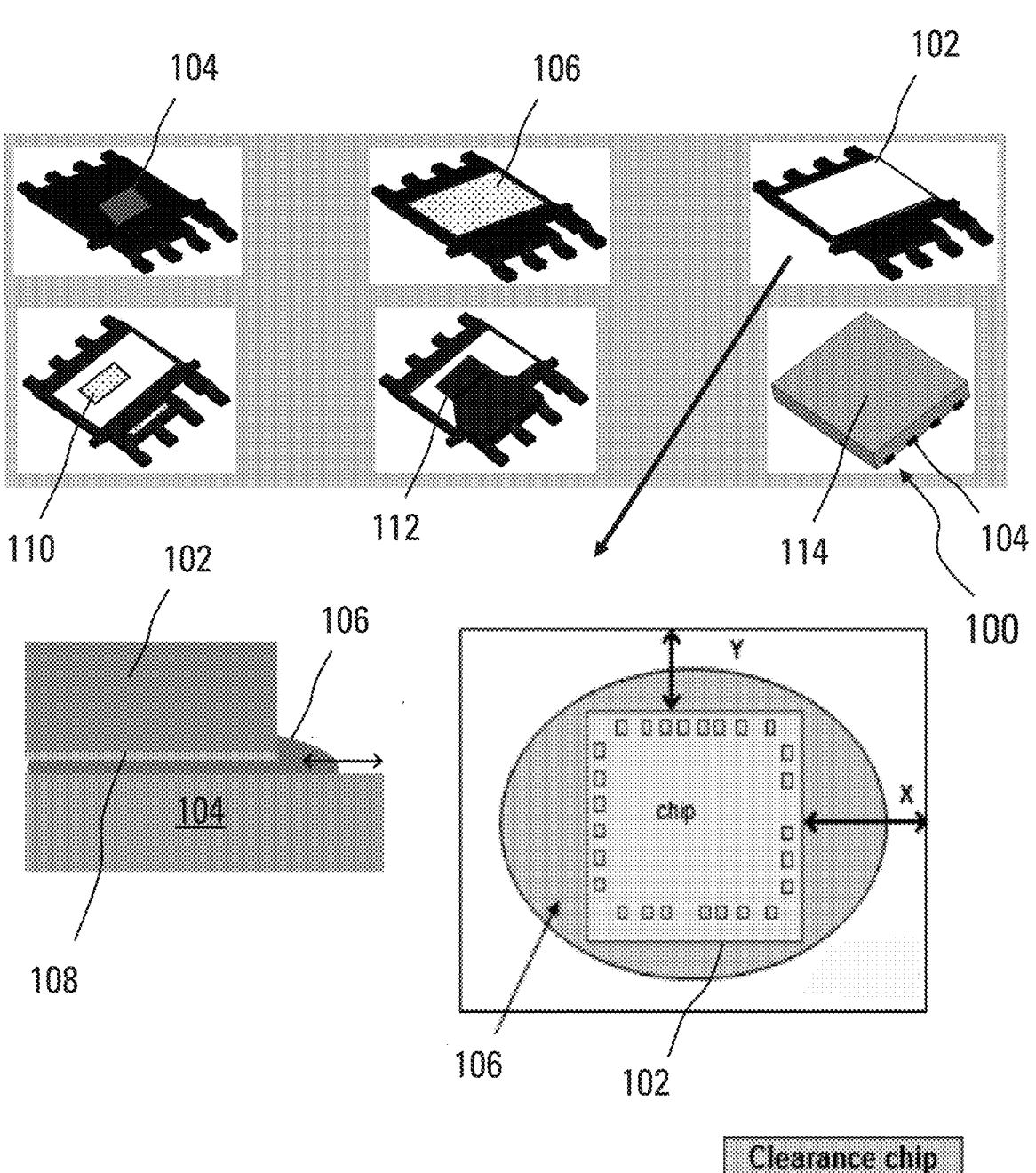
FIG. 1 illustrates a method of forming a chip package according to a prior art and chip size constraints relevant for the chip package of the prior art.
Figure 2:
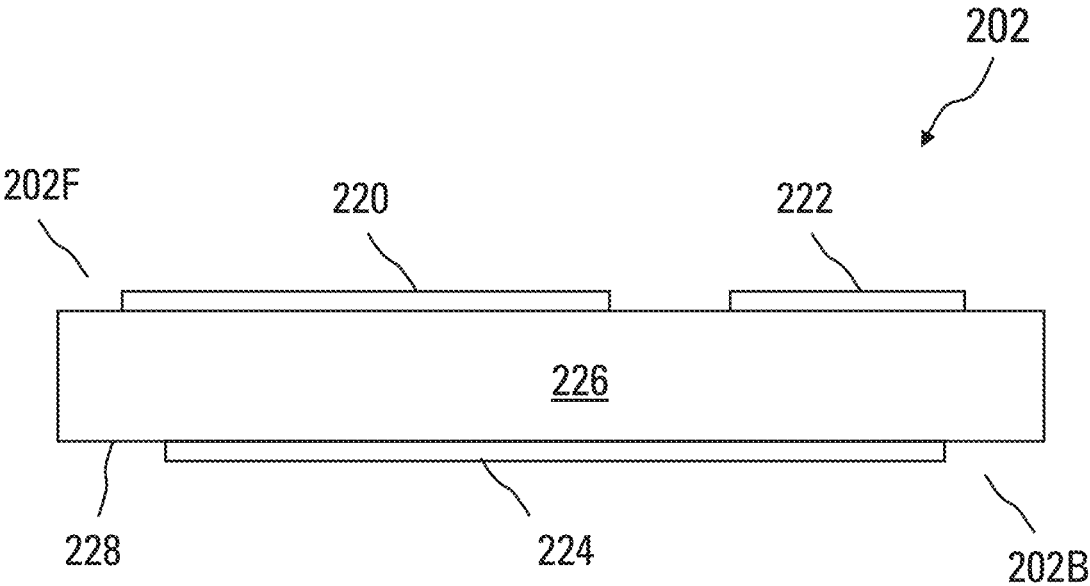
FIG. 2 shows a schematic cross-sectional view of a semiconductor chip in accordance with various embodiments.
Figure 3:
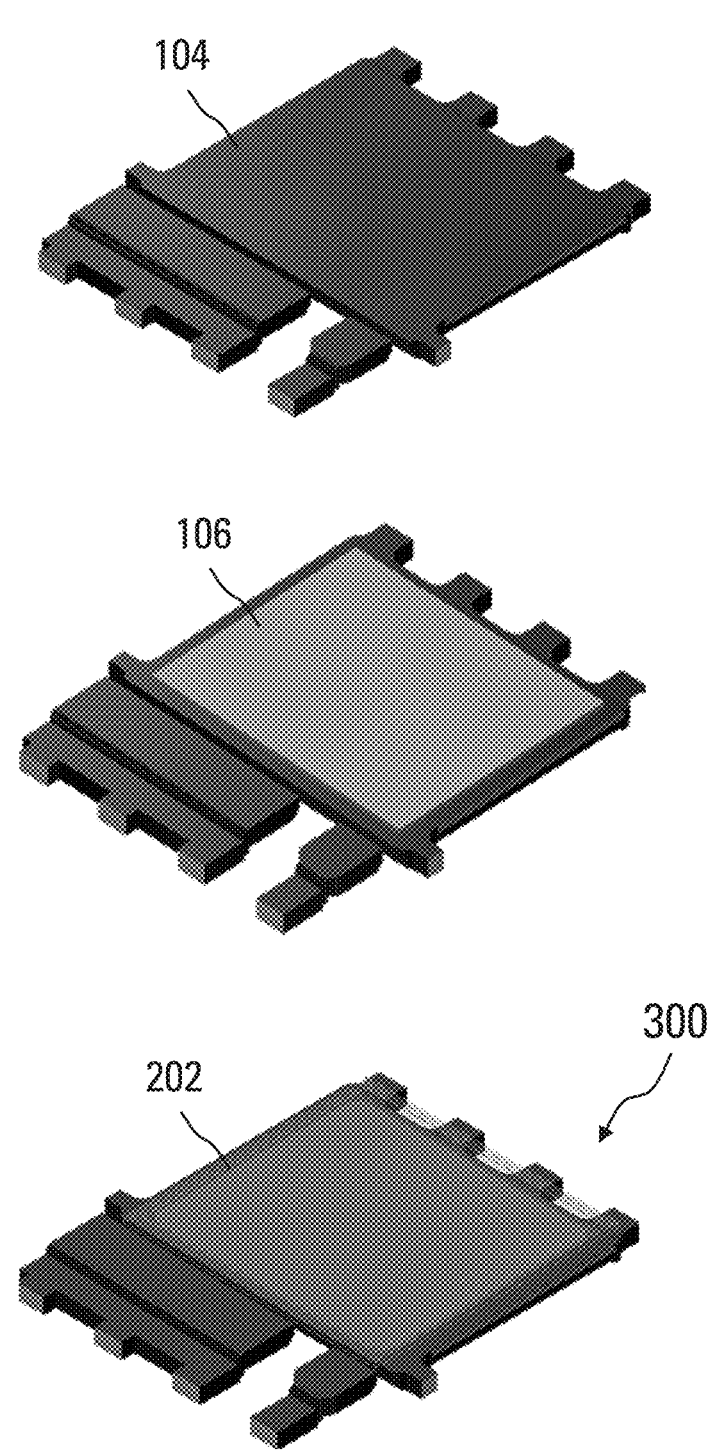
FIG. 3 illustrates a method of forming a chip system in accordance with various embodiments.
Figure 4:
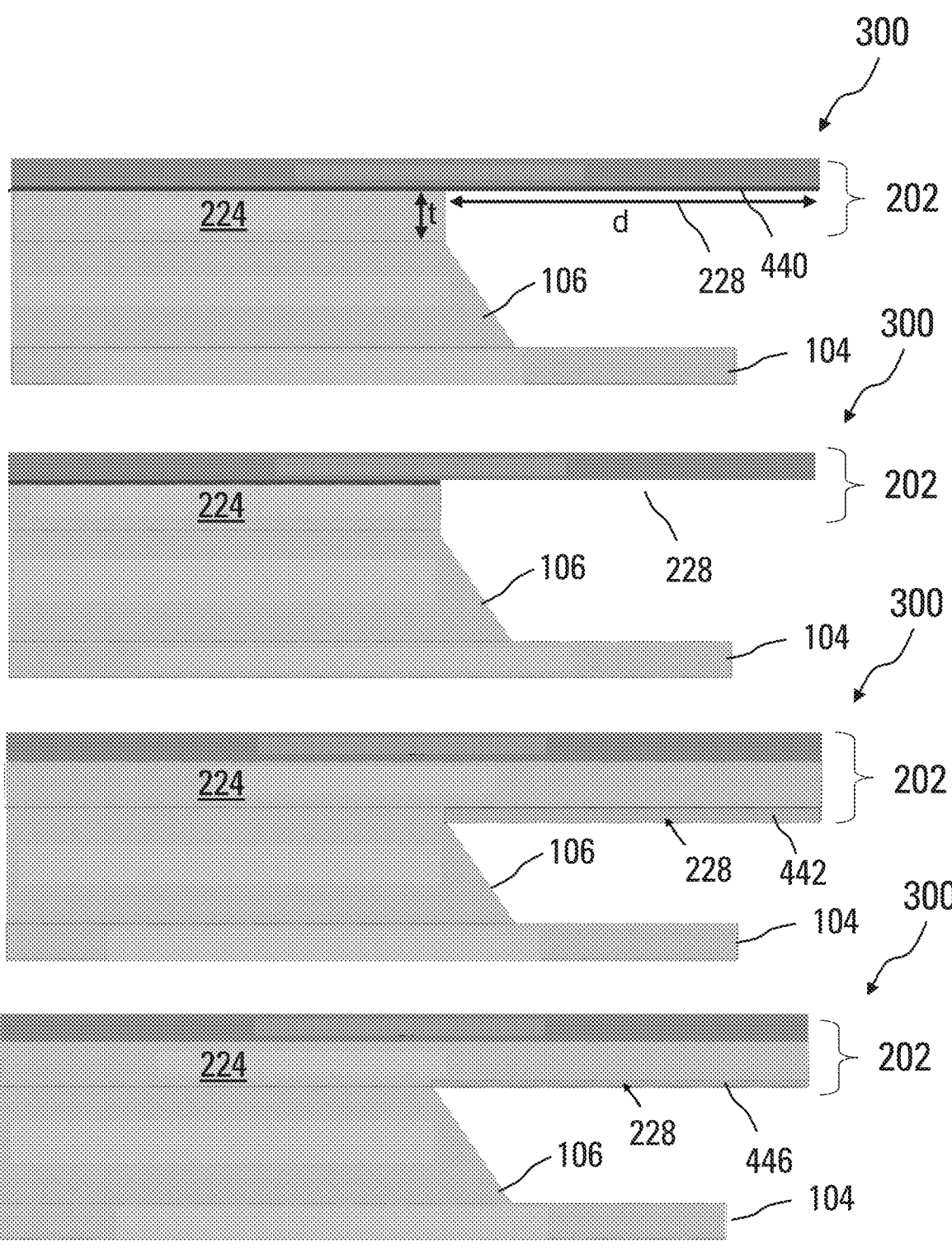
FIG. 4 shows partial schematic cross-sectional views of four chip systems in accordance with various embodiments.
Figure 5:
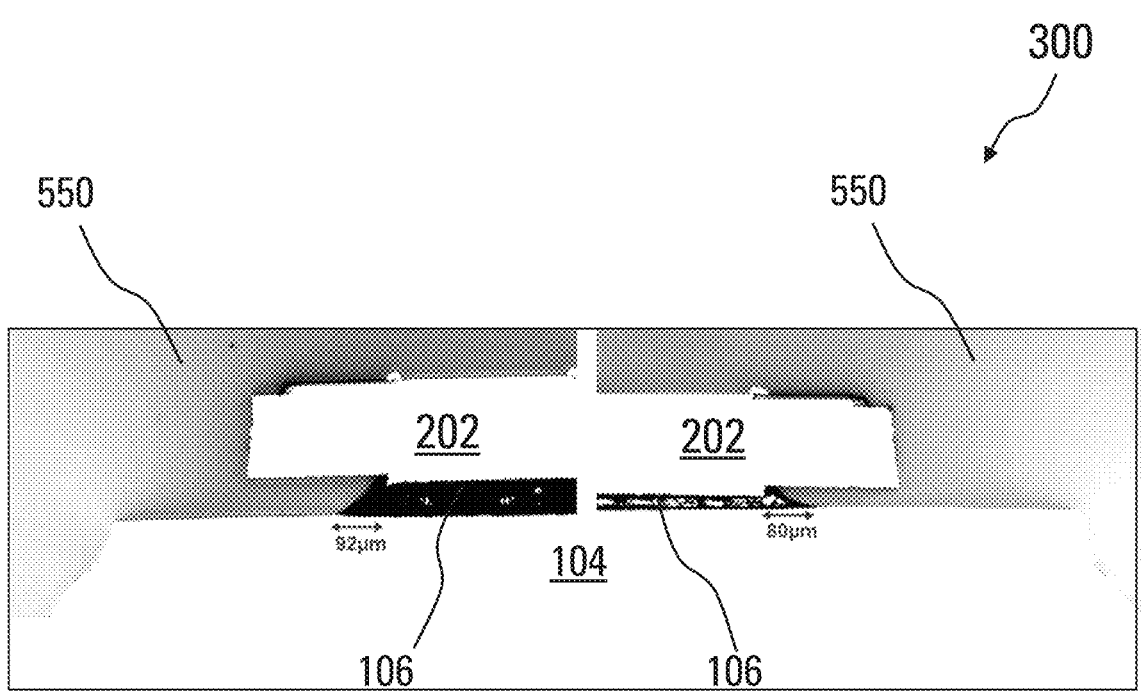
FIG. 5 shows two partial cross-sectional images of a chip system in accordance with various embodiments.

FIG. 2 shows a schematic cross-sectional view of a semiconductor chip 202 in accordance with various embodiments, FIG. 3 illustrates a method of forming a chip system 300 in accordance with various embodiments, FIG. 4 shows partial schematic cross-sectional views of four chip systems 300 in accordance with various embodiments, FIG. 5 shows two partial cross-sectional images of a chip system 300 in accordance with various embodiments, each of FIGS. 6, 7, and 8 illustrates a method of forming a semiconductor chip 202 in accordance with various embodiments as a sequence of schematic process images, FIG. 9A illustrates, as a partial schematic cross-sectional view, a chip system 300 with a chip 202 in a source-down configuration in accordance with various embodiments, FIG. 9B illustrates, as a partial schematic cross-sectional view, a chip system 300 with a chip 202 in a source-up configuration in accordance with various embodiments, and each of FIG. 10A and FIG. 10B illustrates, as schematic cross-sectional views, a chip system 300 in accordance with various embodiments.

The semiconductor chip 202 may include a front side 202F and a back side 202B. The front side 202F may be defined in that it may include a control chip contact and a first controlled chip contact. Both are not indicated in FIG. 2, only the respective pad 222 contacting the control chip contact and pad 220 contacting the first controlled chip contact are shown. The front side metallization may for example include AlCu(3200 nm)/TiW(150 nm)/Cu(4700 nm Sputter).

The back side 202B may be opposite the front side 202F and may include a second controlled chip contact and a backside metallization 224 formed over the back side 202B in contact with the second controlled chip contact.

The back side 202B may further include a stop region 228 extending at least partially along an outer edge of the back side 202B between a contact portion of the backside metallization 224 and the outer edge of the back side 202F, wherein the contact portion corresponds to the portion of the backside metallization 224 that is configured to be attached to an electrically conductive structure 104 (e.g., to a leadframe (see, e.g., FIG. 5 or FIG. 9B, an electrically conductive substrate, or for example a clip 112 (see FIG. 9A)) by a die attach material 106 (e.g., a solder material, e.g. a soft solder or a diffusion solder, or for example an electrically conductive adhesive.

A surface of the stop region 228 may in various embodiments be recessed with respect to a surface of the contact portion, and/or the surface of the stop region 228 may have a lower wettability with respect to the die attach material 106 than the contact portion.

In other words, the stop region 228 may be recessed, may have a low-wettability surface, or both.

In the figures, an embodiment in which the stop region 228 is formed by an only partially removed backside metallization 224 is not shown, but such an embodiment would work for a sufficient height t between a surface of the contact portion of the BSM 224 and the recessed surface of the stop region 228 (see FIG. 4). The height t may for example be in a range from about 1 $\mu$m to about 30 $\mu$m, for example from about 1 $\mu$m to about 10 $\mu$m, for example in a range from about 2 $\mu$m to about 5 $\mu$m. The range between 2 $\mu$m and 5 $\mu$m has shown good results in experiments. Furthermore, a width d of the stop region 228 may be sufficiently large, for example at least 200 $\mu$m, e.g. at least 300 $\mu$m, e.g. at least 400 $\mu$m. In a case where the stop region 228 additionally includes the low-wettability surface, no requirement on the minimum height t may exist, and a limit on the width d of the stop region may be approximately the same as for the BSM-removal-case, e.g. d should be at least about 200 $\mu$m.

Since, on the other hand, a small thickness t of the BSM 224 may be desired to avoid or mitigate chip cracking, a combination of recessing the surface of the stop region 228 and of providing the low-wettability surface of the stop region 228 may have an additional advantage. In various embodiments, for example in a case where chip cracking is avoided by dedicated measures, the structured BSM 224 that protrudes sufficiently far above the stop region 228 to avoid the spillout of the die attach material 106 beyond outer edges of the chip 202 may be used.

In FIG. 4, the embodiments show: In the top panel, the stop region 228 is formed by removing the backside metallization 224 except a titanium liner/seed layer 440. As a consequence, the stop region 228 may be recessed with respect to the contact portion essentially by the thickness of a plated portion of the BSM 224, for example by between 1 μm and 30 μm, for example between 1 μm and 10 μm, for example between 2 μm and 5 μm, and a surface of the stop region 228, which may include or consist of oxidized titanium (TiO) may have a low wettability for various die attach materials 106, for example for various soft solder materials, and also for various electrically conductive adhesives.

In the second panel of FIG. 4, also the titanium liner 440 may be removed, leaving the bare semiconductor material, e.g. silicon, of the semiconductor chip 202. Thus, the stop region 228 is recessed by an amount that is comparable to the example of the top panel. The bare semiconductor material may in various embodiments oxidize, thereby forming a low-wettability oxide surface, e.g. silicon oxide.

In the third panel, the BSM 224 may be present in the stop region 228, in other words, it may extend to an outer edge of the semiconductor chip 202, and a layer 442 may be formed in the stop region 228, for example a polymer layer, e.g., an epoxy layer, an oxide layer, or any other suitable low-wettability material that may be applied in the stop region 228. A better RD Son performance is expected.

In the fourth panel, the BSM 224 may be present in the stop region 228, in other words, it may extend to an outer edge of the semiconductor chip 202, and the stop region 228 may be processed to alter its properties to low wettability. The low-wettability processed portion is indicated by reference number 446. For example, the surface of the stop region 228 may be plasma processed, for example (in FIG. 8, plasma processing using an $O_2$ plasma is shown as an example to form nickel oxide on a first portion of the stop region 228 (where a nickel layer of the BSM 224 was exposed) and silicon oxide on a second portion of the stop region 228 (where pure bulk silicon was exposed)).

FIG. 6, FIG. 7, and FIG. 8 visualize some exemplary methods of forming the semiconductor chip 202 in accordance with various embodiments.

In the process flow 600 of FIG. 6, a silicon chip bulk material 226 is sputtered with a titanium-copper seedlayer 440 (for example about 200 nm titanium and about 300 nm copper), followed by a (copper) plating process for forming the BSM 224P (the P is supposed to indicate that it is a "preliminary" version of the BSM 224). For lithographical structuring of the BSM, a mask layer 662 is applied on the BSM 224P. The subsequent etching process, which may be followed by a process removing the mask layer 662, may expose the bulk silicon 226, thereby forming the stop region 228. An oxide layer that may form from the pure silicon 226 may form a low-wettability surface of the stop region 228.

As shown in the bottom view of FIG. 6 (but applicable to all embodiments), the stop region 228 may in various embodiments be formed as a circumferential region. In other embodiments, the stop region 228 may be formed only partially along an outer edge of the semiconductor chip 202, for example only in a region where the semiconductor chip 202 is supposed to be arranged close to an edge of the electrically conductive structure 104. The stop region 228 may for example extend only along the edge of only one, two, or three of e.g. four circumferential sides of the chip 202, or for example only along a section of one or more of those circumferential sides.

The process flow 700 of FIG. 7 is identical to the process flow of FIG. 6. However, after the exposing of the bare semiconductor bulk material 226, a layer of a low-wettability material 442, e.g. an epoxy material, may be arranged, e.g. via a lithographic process, thereby forming the stop region 228.

In other words, according to the processes described in FIG. 6 and FIG. 7, the BSM 224 may initially be formed as a layer covering the whole back side 202B of the chip 202, and may subsequently be structured.

In the embodiment shown in FIG. 8, the BSM 224 may be formed on the bulk semiconductor material 226 by structured deposition, e.g. by forming a mask 880 on a (e.g. copper) seed layer 660 and subsequently plating a BSM 224 layer, e.g. a copper layer or for example a stack of a copper layer, a nickel layer, and a gold layer on exposed portions of the seed layer 660.

Using further lithography and plasma processing (FIG. 8, left branch), a metal layer stack including copper, nickel and gold may be formed, and a stop region 228 that may include a first recessed surface that may include nickel oxide, and another surface that may be yet further recessed that may include silicon oxide.

Using further lithography and deposition processing (FIG. 8, right branch), a metal layer stack including copper, nickel and gold may be formed, and a stop region 228 that may include a first surface that may include silicon oxide, and another recessed surface that may also include silicon oxide.

Thus, the stop regions 228 of the embodiments shown in FIG. 8 may include a step within the stop region 228 itself, not (or not only, respectively) at its edge.

The semiconductor chip 202 may in various embodiments be a power chip, for example a power transistor.

The embodiments described herein may each have specific advantages and disadvantages compared with each other, and a suitable embodiment may be selected for a given application in consideration of such advantages and disadvantages.

For example, the process shown in FIG. 6 and the embodiments of the two top panels of FIG. 4 may be cost effective, since only a single lithography process may be necessary. Furthermore, no foreign materials may be required, the semiconductor chip 202 may be compatible for reliability requirements, for example in an automotive context, and already established processes may be used.

On the other hand, there is no full coverage of the chip backside 202B by the BSM 224, which may impact the spread resistance, and for thinner chips 202, chip edge crack due to a reduced coverage of the chip BSM 224 may potentially occur.

The solder stop of FIG. 4, third panel, may for example use a solder stop 228 that may include a polymer layer 442, for example an epoxy layer. An advantage may be the full coverage of the BSM 224 over the backside, which may mean that the best electrical performance is obtained. Furthermore, the BSM 224 extending to an outer circumference of the chip may lower the risk of a chip edge crack, and established processes may be used. However, two lithography layers (and in the comparable process of FIG. 8, optionally additional plasma processing may be necessary, which may be expensive. A compatibility with reliability requirements in an automotive context may not be fulfilled due to the epoxy.

FIG. 3, the various panels of FIG. 4, FIG. 5, FIGS. 9A and 9B, and FIGS. 10A and 10B each show a chip system 300 in accordance with various embodiments.

The chip system 300 may include the semiconductor chip 202 as described above, in particular with the contact portion 224 and the stop region 228.

The chip system 300 may further include an electrically conductive structure 104, for example a leadframe, which may optionally include or consist of copper. The leadframe may for example be stamped or etched.

The semiconductor chip 202 may in various embodiments be attached to the electrically conductive structure 104 by the die attach material 106, for example a solder material or an electrically conductive adhesive.

The chip system 300 may in various embodiments be a chip package. In that case, the chip system 300 may optionally include further features, for example a contact structure 112, e.g. a clip, for contacting a chip contact (e.g., a source contact 220) opposite the electrically conductive structure, an encapsulation material 550 (see FIG. 5), or the like.

In various embodiments, the stop region 228 formed on the back side 202B of the semiconductor chip 202 may allow the chip 202 to at least partially extend horizontally to or even beyond an outer edge of the electrically conductive structure 104. Such an extension E is indicated in FIG. 9A.

FIG. 11 shows a process flow 1100 of a method of forming a semiconductor chip in accordance with various embodiments.

The method may include forming a backside metallization over a back side of a semiconductor chip, wherein the semiconductor chip includes a front side including a control chip contact and a first controlled chip contact and a back side including a second controlled chip contact, and the backside metallization is formed in contact with the second controlled chip contact (1110), and forming a stop region extending at least partially along an outer edge of the back side between a contact portion of the backside metallization and the outer edge of the back side, wherein the contact portion is configured to be attached to an electrically conductive structure by a die attach material, wherein a surface of the stop region is recessed with respect to a surface of the contact portion, and/or the surface of the stop region has a lower wettability with respect to the die attach material than the contact portion (1120).

FIG. 12 shows a process flow 1200 of a method of forming a chip system in accordance with various embodiments.

The method may include providing a semiconductor chip with a backside metallization in contact with a backside chip contact, wherein the semiconductor chip comprises a stop region extending at least partially along an outer edge of the back side between a contact portion of the backside metallization and the outer edge of the back side; wherein a surface of the stop region is recessed with respect to a surface of the contact portion, and/or the surface of the stop region has a lower wettability with respect to the die attach material than the contact portion (1210) and attaching the semiconductor chip with its contact portion to an electrically conductive material by a die attach material (1220).

Various examples will be illustrated in the following:

Example 1 is a semiconductor chip. The semiconductor chip may include a front side including a control chip contact and a first controlled chip contact, a back side including a second controlled chip contact, a backside metallization formed over the back side in contact with the second controlled chip contact, and a stop region extending at least partially along an outer edge of the back side between a contact portion of the backside metallization and the outer edge of the back side, wherein the contact portion is configured to be attached to an electrically conductive structure by a die attach material, wherein a surface of the stop region is recessed with respect to a surface of the contact portion, and/or the surface of the stop region has a lower wettability with respect to the die attach material than the contact portion.

In Example 2, the subject-matter of Example 1 may optionally include that the backside metallization is a structured metallization.

In Example 3, the subject-matter of Example 1 or 2 may optionally include that the backside metallization is at least partially removed in the stop region.

In Example 4, the subject-matter of any of Examples 1 to 3 may optionally include that the stop region includes the recessed surface, which is recessed with respect to the surface of the contact portion by between 1 µm and 30 µm, for example between 1 µm and 10 µm, for example between 2 µm and 5 µm.

In Example 5, the subject-matter of any of Examples 1 to 4 may optionally include that the stop region includes at its surface at least one of a group of low-wettability-materials, the group including bare silicon, an oxide, and a polymer.

In Example 6, the subject-matter of any of Examples 1 to 5 may optionally include that the stop region includes at its surface at least one of a group of oxides, the group including silicon oxide, titanium oxide, and nickel oxide.

In Example 7, the subject-matter of any of Examples 1 to 6 may optionally include that the contact portion includes copper at its surface.

In Example 8, the subject-matter of any of Examples 1 to 7 may optionally include that the stop region is formed circumferentially around the contact portion.

In Example 9, the subject-matter of any of Examples 1 to 8 may optionally include that a width of the stop portion between an outer edge of the back side and an outer edge of the contact portion is at least 200 µm.

In Example 10, the subject-matter of any of Examples 1 to 9 may optionally include that the stop region includes a step from the surface of the contact region to the recessed surface of the stop region.

Example 11 is a chip system. The chip system may include the semiconductor chip of any of Examples 1 to 10, and the electrically conductive structure, wherein the semiconductor chip is attached with its contact portion to the electrically conductive structure by the die attach material.

In Example 12, the subject-matter of Example 11 may optionally include that the die attach material includes a solder or an electrically conductive adhesive.

In Example 13, the subject-matter of Example 11 or 12 may optionally include that the semiconductor chip at least partially extends horizontally to an outer edge of the electrically conductive structure.

In Example 14, the subject-matter of any of Examples 11 to 13 may optionally include that the semiconductor chip at least partially extends horizontally beyond an outer edge of the electrically conductive structure.

In Example 15, the subject-matter of any of Examples 11 to 14 may optionally include that the back side is rectangular, and the semiconductor chip extends horizontally beyond an outer edge of the electrically conductive structure with at least one of the sides of the rectangle.

In Example 16, the subject-matter of any of Examples 11 to 15 may optionally include that the electrically conductive structure includes a leadframe.

In Example 17, the subject-matter of any of Examples 11 to 16 may optionally include that the die attach material extends further along the electrically conductive structure than along the stop region into a region between the stop region and the electrically conductive structure.

In Example 18, the subject-matter of any of Examples 11 to 17 may optionally include that a side surface of the semiconductor chip connecting the front surface and the back surface is free from the die attach material.

Example 19 is a method of forming a semiconductor chip. The method may include forming a backside metallization over a back side of a semiconductor chip, wherein the semiconductor chip includes a front side including a control chip contact and a first controlled chip contact and a back side including a second controlled chip contact, and the backside metallization is formed in contact with the second controlled chip contact, and forming a stop region extending at least partially along an outer edge of the back side between a contact portion of the backside metallization and the outer edge of the back side, wherein the contact portion is configured to be attached to an electrically conductive structure by a die attach material, wherein a surface of the stop region is recessed with respect to a surface of the contact portion, and/or the surface of the stop region has a lower wettability with respect to the die attach material than the contact portion.

In Example 20, the subject-matter of Example 19 may optionally include that the forming the backside metallization includes forming a structured backside metallization.

In Example 21, the subject-matter of Example 20 may optionally include that the forming the structured backside metallization includes directly forming the structured backside metallization and/or forming a backside metallization with subsequent structuring.

In Example 22, the subject-matter of any of Examples 19 to 21 may optionally include that the forming the structured backside metallization includes a plating process.

In Example 23, the subject-matter of any of Examples 19 to 22 may optionally further include at least partially removing the backside metallization in the stop region.

In Example 24, the subject-matter of any of Examples 19 to 23 may optionally include that the stop region includes the recessed surface, which is recessed with respect to the surface of the contact portion by between 1 μm and 30 μm, for example between 1 μm and 10 μm, for example between 2 μm and 5 μm.

In Example 25, the subject-matter of any of Examples 19 to 24 may optionally include that the stop region includes at its surface at least one of a group of low-wettability-materials, the group including bare silicon, an oxide, and a polymer.

In Example 26, the subject-matter of Example 25 may optionally include that the low-wettability-material is provided by at least one of a group of processes, the group including etching and/or laser processing the backside metallization for exposing bulk semiconductor material of the chip and/or a seed layer of the backside metallization, depositing a layer of the low wettability material, plasma processing of the bulk semiconductor material of the chip or of a deposited layer, and printing or spraying of the low wettability material.

In Example 27, the subject-matter of any of Examples 19 to 26 may optionally include that the stop region includes at its surface at least one of a group of oxides, the group including silicon oxide, titanium oxide, and nickel oxide.

In Example 28, the subject-matter of any of Examples 19 to 27 may optionally include that the contact portion includes copper at its surface.

In Example 29, the subject-matter of any of Examples 19 to 28 may optionally include that the stop region is formed circumferentially around the contact portion.

In Example 30, the subject-matter of any of Examples 19 to 29 may optionally include that a width of the stop portion between an outer edge of the back side and an outer edge of the contact portion is at least 100 μm.

In Example 31, the subject-matter of any of Examples 19 to 30 may optionally include that the stop region includes a step from the surface of the contact region to the recessed surface of the stop region.

Example 32 is a method of forming a chip system. The method may include attaching a semiconductor chip of any of Examples 1 to 10 to an electrically conductive structure by a die attach material.

In Example 33, the subject-matter of Example 32 may optionally include that the die attach material includes a solder or an electrically conductive adhesive.

In Example 34, the subject-matter of Example 32 or 33 may optionally include that the semiconductor chip at least partially extends horizontally to an outer edge of the electrically conductive structure.

In Example 35, the subject-matter of any of Examples 32 to 34 may optionally include that the semiconductor chip at least partially extends horizontally beyond an outer edge of the electrically conductive structure.

In Example 36, the subject-matter of any of Examples 32 to 35 may optionally include that the back side is rectangular, and the semiconductor chip extends horizontally beyond an outer edge of the electrically conductive structure with at least one of the sides of the rectangle.

In Example 37, the subject-matter of any of Examples 32 to 36 may optionally include that the electrically conductive structure includes a leadframe.

In Example 38, the subject-matter of any of Examples 32 to 37 may optionally include that the die attach material extends further along the electrically conductive structure than along the stop region into a region between the stop region and the electrically conductive structure.

In Example 39, the subject-matter of any of Examples 32 to 38 may optionally include that a side surface of the semiconductor chip connecting the front surface and the back surface is free from the die attach material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor chip, comprising:
a front side;
a back side comprising a second controlled chip contact;
a backside metallization formed over the back side in contact with the second controlled chip contact; and
a stop region on the back side extending at least partially along an outer edge of the back side between a contact portion of the backside metallization and the outer edge of the back side, wherein the contact portion is configured to be attached to an electrically conductive structure by a die attach material;
wherein at least a portion of a surface of the stop region is recessed with respect to a surface of the contact portion and the surface of the stop region has a lower wettability with respect to the die attach material than an entirety of the contact portion.

2. The semiconductor chip of claim 1,
wherein the backside metallization is a structured metallization.

3. The semiconductor chip of claim 1,
wherein the backside metallization is at least partially removed in the stop region.

4. The semiconductor chip of claim 1,
wherein the stop region comprises the recessed surface, which is recessed with respect to the surface of the contact portion by between 1 and 30 μm.

5. The semiconductor chip of claim 1,
wherein the stop region comprises at its surface at least one of a group of low-wettability-materials, the group comprising:
bare silicon;
an oxide; and
a polymer.

6. The semiconductor chip of claim 1,
wherein the stop region comprises at its surface at least one of a group of oxides, the group comprising:
silicon oxide;
titanium oxide; and
nickel oxide.

7. The semiconductor chip of claim 1,
wherein the stop region is formed circumferentially around the contact portion.

8. A chip system, comprising:
the semiconductor chip of claim 1; and
the electrically conductive structure,
wherein the semiconductor chip is attached to the electrically conductive structure by the die attach material.

9. The chip system of claim 8,
wherein the semiconductor chip at least partially extends horizontally to or beyond an outer edge of the electrically conductive structure.

10. A method of forming a chip system, the method comprising:
attaching a semiconductor chip of claim 1 to an electrically conductive structure by a die attach material.

11. The semiconductor chip of claim 1, wherein the front side includes a control chip contact and a first controlled chip contact.

12. A method of forming a semiconductor chip, the method comprising:
forming a backside metallization over a back side of a semiconductor chip, wherein the semiconductor chip comprises a front side and the back side comprising a second controlled chip contact, and the backside metallization is formed in contact with the second controlled chip contact; and
forming a stop region on the back side extending at least partially along an outer edge of the back side between a contact portion of the backside metallization and the outer edge of the back side, wherein the contact portion is configured to be attached to an electrically conductive structure by a die attach material;
wherein at least a portion of a surface of the stop region is recessed with respect to a surface of the contact portion and the surface of the stop region has a lower wettability with respect to the die attach material than an entirety of the contact portion.

13. The method of claim 12,
wherein the forming the backside metallization comprises forming a structured backside metallization.

14. The method of claim 12, further comprising:
at least partially removing the backside metallization in the stop region.

15. The method of claim 12, further comprising:
forming a low-wettability-material at a surface of the stop region by at least one of a group of processes, the group comprising:
etching and/or laser processing the backside metallization for exposing bulk semiconductor material of the chip and/or a seed layer of the backside metallization;
depositing a layer of the low wettability material;
plasma processing of the bulk semiconductor material of the chip or of a deposited layer; and
printing or spraying of the low wettability material.

16. A semiconductor chip, comprising:
a front side;
a back side comprising a second controlled chip contact;
a backside metallization formed over the back side in contact with the second controlled chip contact; and
a stop region on the back side extending at least partially along an outer edge of the back side between a contact portion of the backside metallization and the outer edge of the back side, wherein the contact portion is configured to be attached to an electrically conductive structure by a die attach material;
wherein at least a portion of a surface of the stop region is recessed with respect to a surface of the contact portion and the surface of the stop region has a lower wettability with respect to the die attach material than the contact portion; and
wherein the stop region comprises at its surface at least one of a group of low-wettability-materials, the group comprising:
a polymer; and
an oxide comprising at least one of a group of oxides comprising:
silicon oxide;
titanium oxide; and
nickel oxide.

* * * * *